United States Patent
Lu et al.

(10) Patent No.: US 10,910,158 B2
(45) Date of Patent: Feb. 2, 2021

(54) CAPACITOR AND METHOD FOR FABRICATING THE SAME

(71) Applicant: SHENZHEN WEITONGBO TECHNOLOGY CO., LTD., Shenzhen (CN)

(72) Inventors: Bin Lu, Shenzhen (CN); Jian Shen, Shenzhen (CN)

(73) Assignee: SHENZHEN WEITONGBO TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/666,478

(22) Filed: Oct. 29, 2019

(65) Prior Publication Data

US 2020/0066443 A1 Feb. 27, 2020

Related U.S. Application Data

(63) Continuation of application No. PCT/CN2018/101535, filed on Aug. 21, 2018.

(51) Int. Cl.
| | |
|---|---|
| *H01G 4/01* | (2006.01) |
| *H01L 21/768* | (2006.01) |
| *H01L 21/306* | (2006.01) |
| *H01L 49/02* | (2006.01) |

(52) U.S. Cl.
CPC ......... *H01G 4/01* (2013.01); *H01L 21/30608* (2013.01); *H01L 21/7687* (2013.01); *H01L 21/7688* (2013.01); *H01L 28/86* (2013.01); *H01L 28/88* (2013.01)

(58) Field of Classification Search
None
See application file for complete search history.

(56) References Cited

U.S. PATENT DOCUMENTS

| | | | |
|---|---|---|---|
| 5,438,011 A * | 8/1995 | Blalock | H01L 27/10817 257/E21.012 |
| 6,210,595 B1 | 4/2001 | Weinrich et al. | |
| 8,115,277 B2 | 2/2012 | Von Kluge | |
| 2001/0016226 A1 * | 8/2001 | Natzle | H01L 29/513 427/79 |
| 2003/0036244 A1 | 2/2003 | Jones et al. | |

(Continued)

FOREIGN PATENT DOCUMENTS

| | | |
|---|---|---|
| CN | 101257016 A | 9/2008 |
| CN | 102104009 A | 6/2011 |

(Continued)

*Primary Examiner* — Alexander G Ghyka

(57) ABSTRACT

A capacitor and a method of fabricating the capacitor are provided. The capacitor includes a structure for forming a three-dimensional capacitor, the structure being a pillar structure or a trench structure; where when the structure is a pillar structure, the aspect ratio of the pillar structure is more than 10; when the structure is a trench structure, the capacitor further includes a substrate, the trench structure is formed by a material layer disposed on the surface of a base trench of the substrate, and the aspect ratio of the trench structure is more than 10. The aspect ratio of the pillar structure of the capacitor or the aspect ratio of the trench structure may be more than 10, so that the performance of the capacitor is better.

7 Claims, 13 Drawing Sheets

(56) References Cited

U.S. PATENT DOCUMENTS

| | | | |
|---|---|---|---|
| 2004/0036051 A1* | 2/2004 | Sneh | H01L 27/10861 |
| | | | 251/301 |
| 2004/0092072 A1 | 5/2004 | Kim | |
| 2005/0219788 A1 | 10/2005 | Chow et al. | |
| 2009/0176011 A1 | 7/2009 | Kiehlbauch | |
| 2014/0104745 A1 | 4/2014 | Zheng | |
| 2015/0115401 A1 | 4/2015 | Zhang et al. | |

FOREIGN PATENT DOCUMENTS

| | | |
|---|---|---|
| CN | 106024387 A | 10/2016 |
| EP | 1724785 A1 | 11/2006 |
| WO | 2009/090520 A1 | 7/2009 |
| WO | 2017147511 A1 | 8/2017 |

\* cited by examiner

US 10,910,158 B2

CAPACITOR AND METHOD FOR FABRICATING THE SAME

CROSS REFERENCE TO RELATED APPLICATIONS

The present application is a continuation of international application No. PCT/CN2018/101535, filed on Aug. 21, 2018, which is hereby incorporated by reference in its entirety.

TECHNICAL FIELD

Embodiments of the present disclosure relate to the field of semiconductor technology, and specifically to a capacitor and a method of making the capacitor.

BACKGROUND

Wafer-level 3D capacitors, which also referred to as three-dimensional capacitors, are a new type of capacitors that have emerged in recent years. The 3D capacitors are manufactured by means of advanced semiconductor processing technology. When a 3D capacitor is fabricated, a 3D structure having an aspect ratio (AR) needs to be etched first on a substrate, and then electrodes, a dielectric film and the like of the 3D capacitor are fabricated on the surface of the 3D structure to complete the processing of the 3D capacitor.

It is well known that the capacitance of a capacitor is proportional to the contact area between an electrode and a dielectric medium. That is, if the AR of the 3D structure is higher, the contact area between the electrode and the dielectric medium is larger, and the capacitance of the 3D capacitor is higher.

However, in the related art, due to the limitations of technological capability and processing cost, direct processing of the 3D structure with high AR is difficult and costly, so that the capacitance density of the 3D capacitor cannot be effectively improved.

SUMMARY

The embodiments of the present disclosure are directed to provide a capacitor and a processing method thereof for solving at least the problem of low capacitance density of a 3D capacitor in the related art.

To achieve the objectives of the embodiments of the present disclosure, an embodiment of the present disclosure provides a capacitor, including a structure for forming a three-dimensional capacitor, the structure being a pillar structure or a trench structure; where when the structure is a pillar structure, the aspect ratio of the pillar structure is more than 10; when the structure is a trench structure, the capacitor further includes a substrate, the trench structure is formed by a material layer disposed on the surface of a base trench of the substrate, and the aspect ratio of the trench structure is more than 10.

According to another aspect of the embodiments of the present disclosure, a capacitor processing method for processing the above capacitor is provided, the method including: when the structure is a pillar structure, processing a base protrusion on a substrate, and etching the base protrusion to form the pillar structure having an aspect ratio more than 10; or, when the structure is a trench structure, processing a base trench on the substrate, and covering the surface of the base trench with a material layer to form the trench structure having an aspect ratio more than 10; and processing based on the pillar structure or trench structure to form a capacitor.

The embodiments of the present disclosure provide a capacitor and a processing method thereof, where the structure of the capacitor for forming a three-dimensional capacitor may be not only a trench structure disposed on a substrate, but also a pillar structure. The pillar structure is convenient to form and process, the pillar structure having a large AR can be processed with low cost, and the aspect ratio of the pillar structure can be ensured to reach 10 or more, thereby overcoming the problem in the related art that a capacitor having an overlarge aspect ratio is difficult to process through a trench due to the limitations of processing technology and cost, and improving the capacitance density of the processed capacitor. In addition, a material layer is disposed in a base trench of the substrate, the AR of the trench structure formed based on the material layer is increased compared to the base trench, but the depth is not increased, thereby avoiding the problem of processing failure due to excessive depth while increasing the AR. The AR of the trench structure is more than 10, thereby ensuring that the capacitance density of the capacitor based on the trench structure is improved.

BRIEF DESCRIPTION OF THE DRAWINGS

To describe the technical solutions in the embodiments of the present disclosure or in the related art more clearly, the following briefly introduces the accompanying drawings required for describing the embodiments or the related art. Apparently, the accompanying drawings in the following description show only some embodiments of the present disclosure, and a person of ordinary skill in the art may still derive other drawings from these accompanying drawings.

Figure 1:
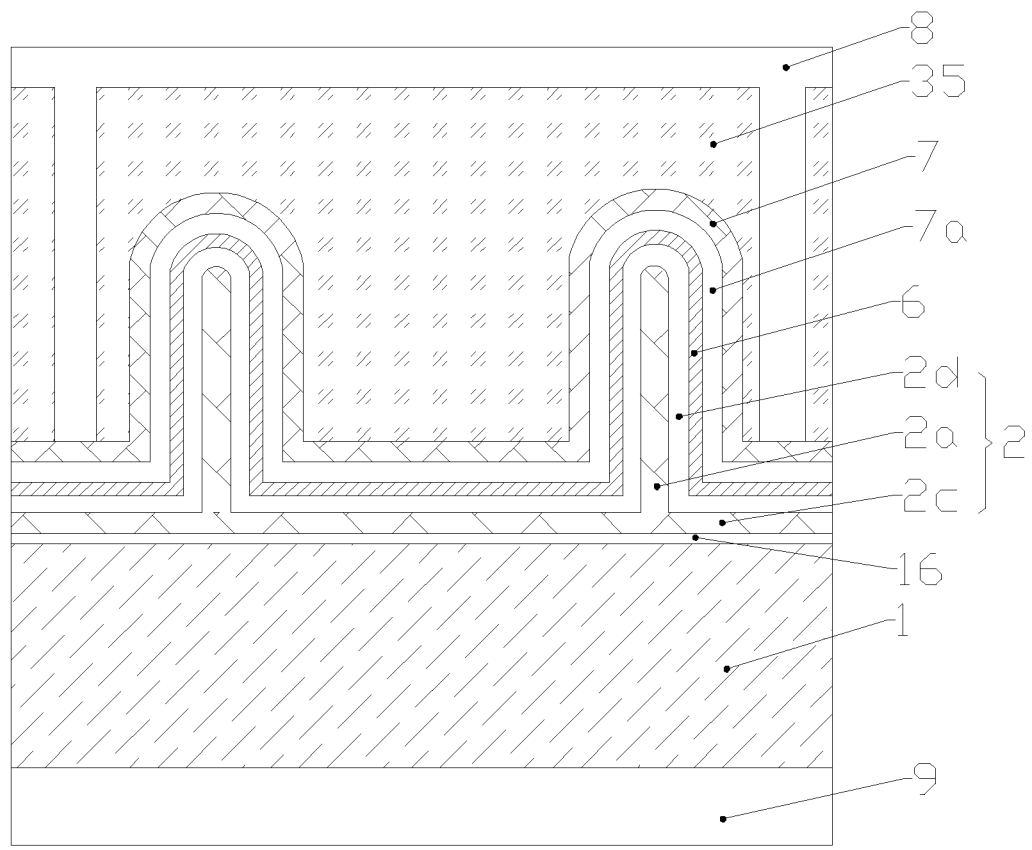
FIG. 1 is a schematic structural diagram of a first capacitor according to an embodiment of the present disclosure.

REFERENCE SIGNS 1, substrate; 2, first conductor layer; 2a, pillar structure; 2b, trench structure; 2c, seed layer; 2d, first isolating layer; 3, base trench; 4, material layer; 6, first insulating layer; 7, second conductor layer; 7a, second isolating layer; 8, first electrode; 9, second electrode; 10, barrier layer; 11, third conductor layer; 12a, upper electrode; 12b, lower electrode; 13, second insulating layer; 14a, third isolating layer; 14c, fourth isolating layer; 15, base protrusion; 16, adhesion layer; 18, sacrificial material layer; 19, preformed groove; 35, glass protective layer.

DETAILED DESCRIPTION

The embodiments of the present disclosure will be described in detail below with reference to the drawings and embodiments, so that the application of technical means to solve the technical problems and achieve the technical effects can be fully understood and implemented.

As shown in FIGS. 1 to 5 and 19, according to an embodiment of the present disclosure, a capacitor includes a structure for forming a three-dimensional capacitor, the structure being a pillar structure 2a or a trench structure 2b. When the structure is a pillar structure 2a, the aspect ratio of the pillar structure 2a is more than 10. When the structure is a trench structure 2b, the capacitor further includes a substrate 1, the trench structure 2b is formed by a material layer 4 disposed on the surface of a base trench 3 of the substrate 1, and the aspect ratio of the trench structure 2b is more than 10. The pillar structure also can be called a bump structure or wall structure in the field.

In the related art, when a three-dimensional capacitor is processed, a trench with certain aspect ratio (AR) is processed on the substrate, and then the trench is filled with an insulating material and a conductive material to form the capacitor. In order to improve the capacitance density of the capacitor, the AR of the trench needs to be increased as much as possible to enlarge the contact area of electrodes. However, due to the limitations of processing technology, it is difficult to directly process a trench with large AR, so that the capacitance density of the three-dimensional capacitor is difficult to improve.

In the capacitor of the present disclosure, the structure for forming a three-dimensional capacitor may be not only a trench structure 2b disposed on a substrate, but also a pillar structure 2a. The pillar structure 2a is convenient to form and process, the pillar structure 2a having a large AR can be processed with low cost, and the aspect ratio of the pillar structure 2a can be ensured to reach 10 or more, thereby overcoming the problem in the related art that a capacitor having an overlarge aspect ratio is difficult to process, and improving the capacitance density of the processed capacitor. In addition, a material layer 4 is disposed in a base trench 3 of the substrate 1, the AR of the trench structure 2b formed based on the material layer 4 is increased compared to the base trench 3, but the depth is not increased (the width is decreased), thereby avoiding the problem of processing failure due to excessive depth while increasing the AR. The AR of the trench structure 2b is more than 10, thereby ensuring a higher capacitance density of the capacitor based on the trench structure 2b.

It should be noted that the pillar structure 2a may be any appropriate structure such as a columnar protrusion, a wall-shaped protrusion (such as a strip protrusion having a rectangular cross section), or a tapered protrusion, which is not limited in the present embodiment. The trench structure 2b may be any appropriate structure such as a trench, or a through-silicon-via (TSV) formed on the substrate 1, which is not limited in the present embodiment.

Figure 11:
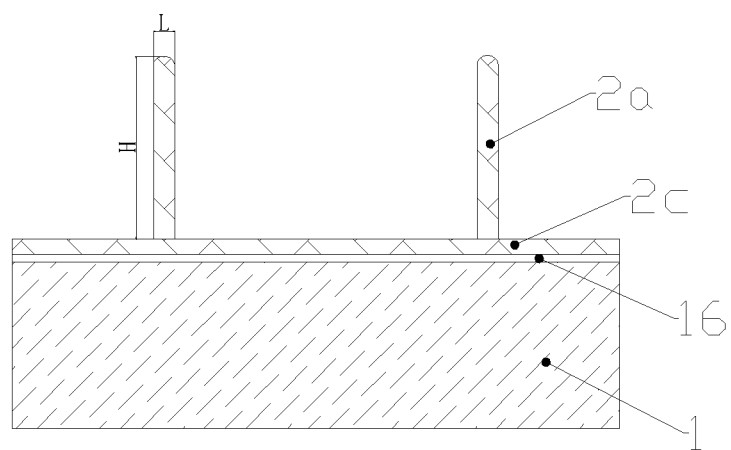
FIG. 11 is a schematic structural diagram of pillar structures processed for the first capacitor according to an embodiment of the present disclosure.

The aspect ratio of the pillar structure 2a in the present embodiment indicates the ratio of the height (H) to the width (L) of the pillar structure 2a in FIG. 11. Similarly, the aspect ratio of the trench structure 2b indicates the ratio of the depth to the width of the trench structure 2b.

In an embodiment of the present disclosure, preferably, the aspect ratio of the pillar structure 2a is more than 10 and less than or equal to 500, and the aspect ratio of the trench structure 2b is more than 10 and less than or equal to 500. The aspect ratio of the pillar structure 2a and the aspect ratio of the trench structure 2b are preferred based on the factors such as technological realization, processing cost, and processing efficiency. For example, the aspect ratio of the pillar structure 2a or the aspect ratio of the trench structure 2b may be 10, 14, 15, 20, 21, 25, 50, 51, 55, 100, 150, 200, 250, 300, 350, 400, 450, 500, etc.

Of course, in other embodiments, the aspect ratio of the pillar structure 2a and the aspect ratio of the trench structure 2b may be more than 500.

Three-dimensional capacitors formed by the pillar structure 2a and the trench structure 2b will be respectively described in detail below.

Figure 2:
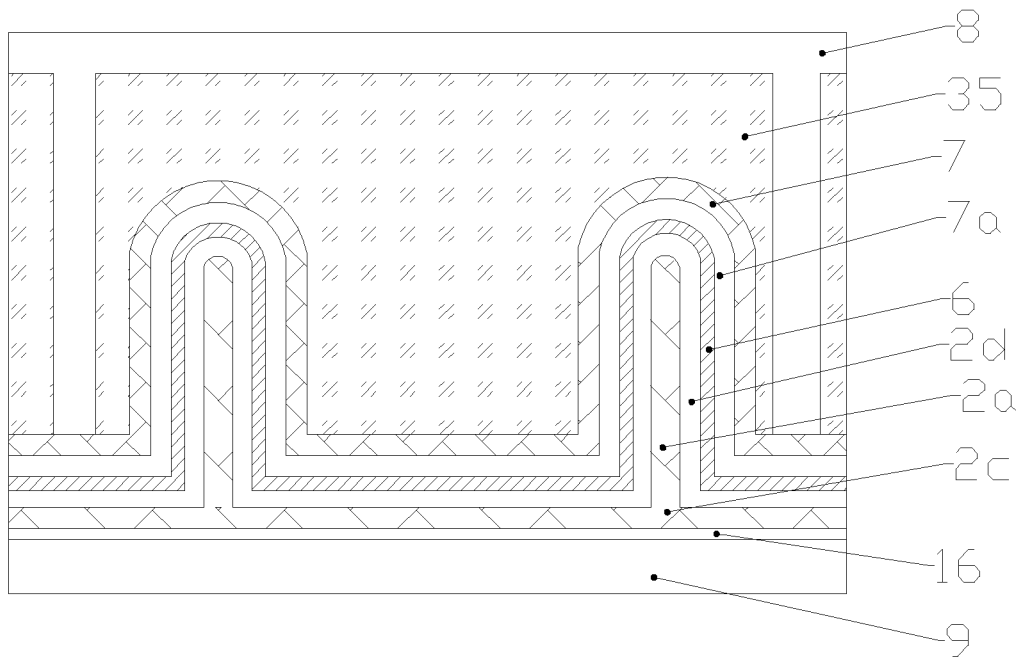
FIG. 2 is a schematic structural diagram of a second capacitor according to an embodiment of the present disclosure.

As shown in FIGS. 1 and 2, when the structure is a pillar structure 2a, the capacitor includes a first conductor layer 2, a first insulating layer 6, and a second conductor layer 7, which are sequentially stacked on a substrate 1 to form the capacitor. It should be noted that the stacking of the first conductor layer 2, the first insulating layer 6 and the second conductor layer 7 is not necessarily close stacking, other structure may be disposed between the first conductor layer 2 and the first insulating layer 6 as needed, and other structure may also be disposed between the first insulating layer 6 and the second conductor layer 7.

Based on different requirements and costs, the substrate 1 may be selected from different structures and materials. For example, the substrate 1 may be a silicon wafer or glass. When glass is used as the substrate 1, the substrate 1 may be removed during the processing of the capacitor to form a substrate-free capacitor. For example, when a second electrode 9 is formed, the glass substrate 1 is removed.

In the present embodiment, the first conductor layer 2 is disposed adjacent to the substrate 1, includes the pillar structure 2a, and covers at least part of the substrate 1.

Specifically, as shown in FIG. 1, the first conductor layer 2 includes a seed layer 2c in addition to the pillar structure 2a having a high aspect ratio. In one embodiment, the seed layer 2c may be connected to the substrate 1 through an adhesion layer 16. When the substrate 1 is a silicon wafer, the adhesion layer 16 may be of a material that has good adhesion and does not affect the performance of the capacitor. When the substrate 1 is glass, the adhesion layer 16 may be of a UV adhesive, which facilitates the removal of the substrate 1 in the subsequent process. The first conductor layer 2 formed by the combination of the pillar structure 2a and the seed layer 2c has a large area, which can greatly increase the capacity of the capacitor and reduce the size of the capacitor. The material of the first conductor layer 2 may be a conductor of various materials, preferably a metal conductor having a low resistivity, such as copper or other low resistivity material.

In the present embodiment, the materials of the seed layer 2c and the pillar structure 2a of the first conductor layer 2 may be copper (Cu), stannum (Sn), nickel (Ni) or the like, for example, the both are copper. The copper is good in conductivity and low in cost.

The copper is relatively active and easy to diffuse. In order to prevent the copper from diffusing into the substrate 1 or other structure of the capacitor to affect the performance of the capacitor, the seed layer 2c is connected to the substrate 1 through the adhesion layer 16 in the present embodiment. The adhesion layer 16 mainly functions to improve the adhesion between the substrate 1 and the seed layer 2c. The material of the adhesion layer 16 may be determined as needed. For example, if the material of the substrate 1 is silicon and the material of the seed layer 2c is copper, the adhesion layer 16 is preferably made of a material that has low resistivity and is capable of preventing the copper from diffusing into the substrate 1, for example, titanium nitride (TiN), tantalum (Ta), tantalum nitride (TaN) or a combination of the materials. If the substrate 1 is glass, the adhesion layer 16 may be made of a UV adhesive.

The material of the seed layer 2c may be nickel or the like. If a material which is not easily diffused such as nickel is used, the adhesion layer 16 may be made of other material, or the adhesion layer 16 may be omitted as needed.

The first insulating layer 6 is mainly used to form a dielectric layer of the capacitor, and is usually made of a material having a high dielectric constant, such as aluminum oxide, hafnium oxide, zirconium oxide, titanium dioxide, lead zirconate titanate or the like to increase the capacity of the capacitor and obtain better performance of the capacitor.

In the present embodiment, as shown in FIG. 1, the first insulating layer 6 covers the first conductor layer 2. When the material of the first conductor layer 2 is copper, a first isolating layer 2d is disposed between the first insulating layer 6 and the first conductor layer 2 in order to prevent the copper in the first conductor layer 2 from diffusing toward the first insulating layer 6. Similarly, if the material of the second conductor layer 7 is copper, a second isolating layer 7a may be disposed between the first insulating layer 6 and the second conductor layer 7 in order to prevent the substances in the second conductor layer 7 from diffusing into the first insulating layer 6.

The first isolating layer 2d and the second isolating layer 7a are used to prevent the substances (e.g., copper) of the first conductor layer 2 and the second conductor layer 7 from diffusing toward the first insulating layer 6 to ensure the insulating property, thereby ensuring the performance of the capacitor. The materials of the first isolating layer 2d and the second isolating layer 7a may be titanium nitride or the like. The titanium nitride with low resistivity can prevent copper from diffusing toward the first insulating layer 6.

Figure 6:
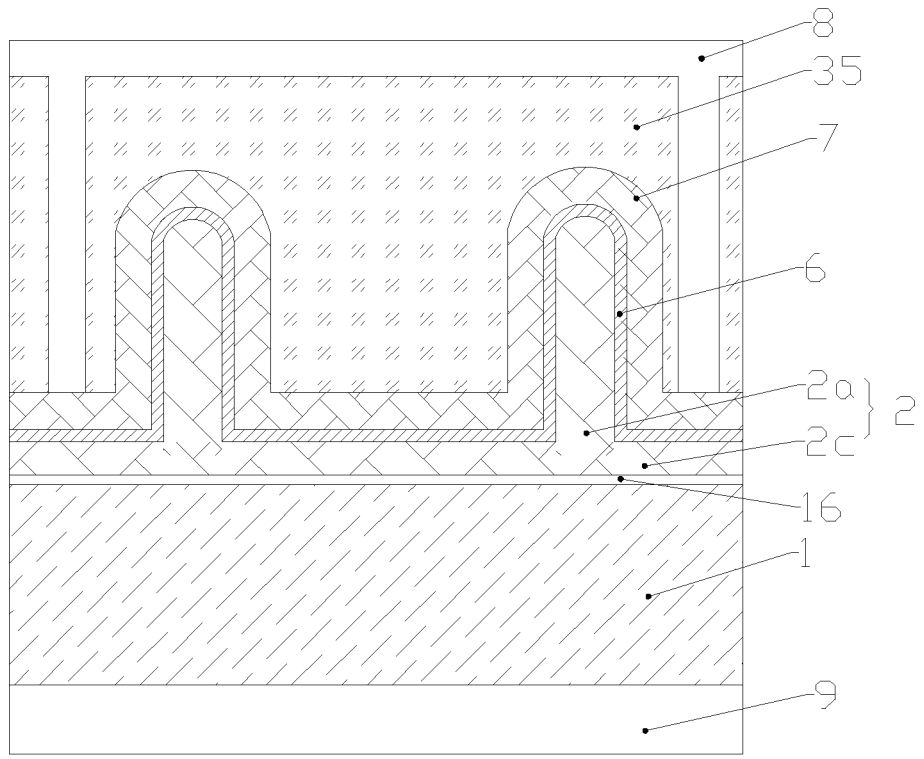
FIG. 6 is a schematic structural diagram of a sixth capacitor according to an embodiment of the present disclosure.
Figure 7:
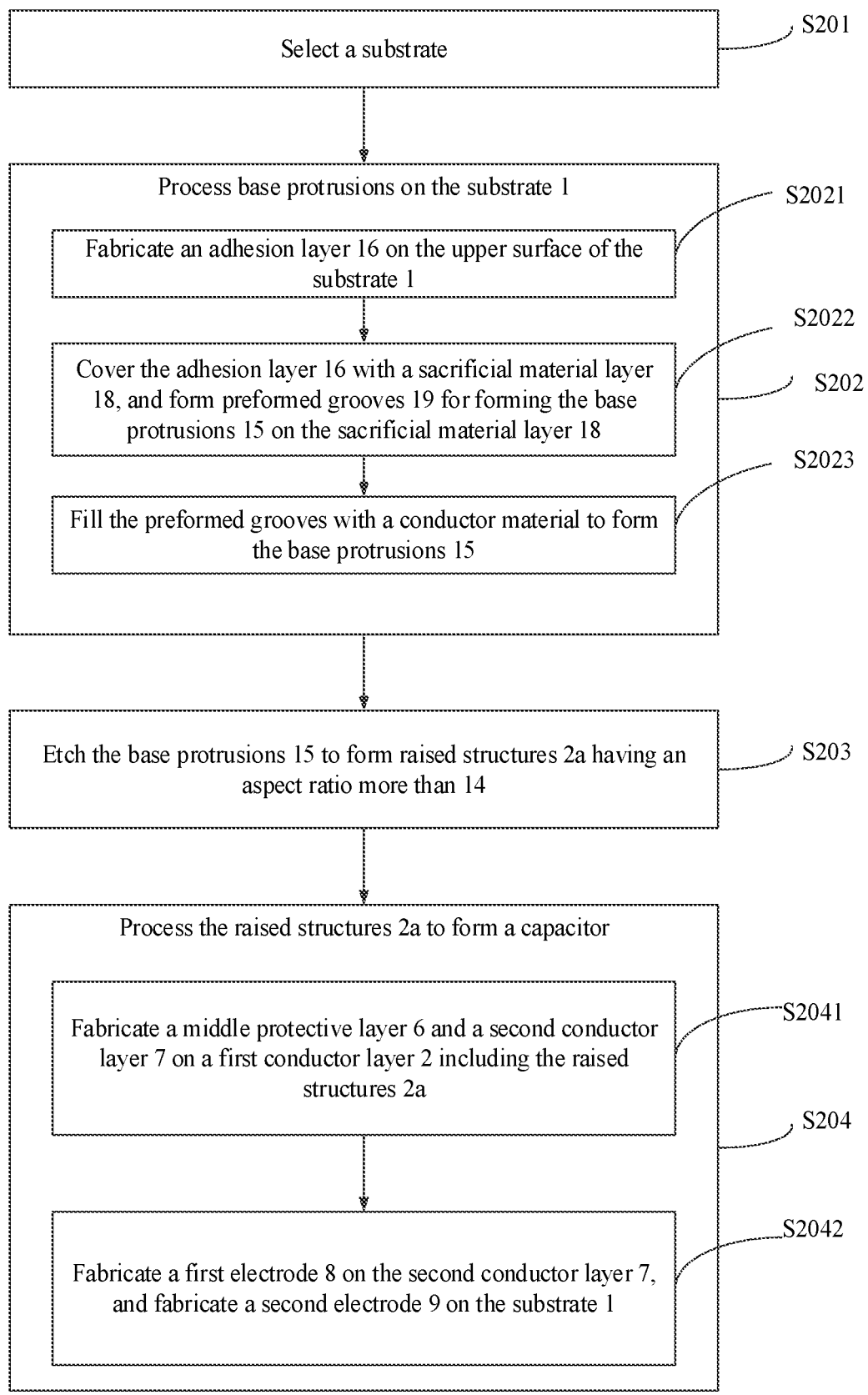
FIG. 7 is a schematic flowchart of a first capacitor processing method according to an embodiment of the present disclosure.

As shown in FIG. 6, if the material of the first conductor layer 2 is a non-diffusible material except copper, such as nickel, or the performance of the first insulating layer 6 is not affected by copper diffusion, the first isolating layer 2d and the second isolating layer 7a may be omitted, the first insulating layer 6 is in direct contact with the first conductor layer 2 and covers the first conductor layer 2, and the second conductor layer 7 directly covers the surface of the first insulating layer 6. It should be noted that the coverage may be full coverage or partial coverage.

Optionally, in the present embodiment, the capacitor further includes a first electrode 8 and a second electrode 9 for connecting the capacitor to other structure or component. The first electrode 8 is electrically connected to the second conductor layer 7, and the second electrode 9 is electrically connected to the first conductor layer 2. For example, when the substrate 1 is a silicon wafer, the second electrode 9 is electrically connected to the first conductor layer 2 through the substrate 1. When the capacitor does not contain a substrate, the second electrode 9 may be adhered to the surface of the seed layer 2c through the adhesion layer 16, referring to FIG. 2.

As shown in FIGS. 3-5 and 19, when the structure is a trench structure 2b, the capacitor includes an upper electrode 12a, a second insulating layer 13, a lower electrode 12b, etc. in addition to the substrate 1 and the trench structure 2b, where the trench structure 2b may be formed through a material layer 4. The structure of the substrate 1 may be the same as or similar to the structure of the substrate 1 when the structure is a pillar structure 2a, so details are not described herein again.

In a feasible manner, when the structure is a trench structure 2b, the material layer 4 includes a barrier layer 10 and a third conductor layer 11 sequentially stacked. The barrier layer 10 is disposed adjacent to the substrate 1, and includes at least one of a titanium (Ti) layer, a titanium nitride (TiN) layer, a tantalum (Ta) layer, and a tantalum nitride (TaN) layer. The barrier layer 10 may be one layer or a plurality of layers. When the barrier layer 10 is a plurality of layers, the material of each layer may be different or partially identical. The third conductor layer 11 includes a copper layer, and the copper layer is formed by electroplating. The barrier layer 10 can prevent copper in the third conductor layer 11 from diffusing toward the substrate 1, and prevent the performance of the capacitor from being affected by copper diffusion.

The material of the barrier layer 10 may be the same as the materials of the first isolating layer 2d and the second isolating layer 7a, for example, the three are titanium nitride layers; or different materials are used, for example, the barrier layer 10 is a titanium nitride layer, and the first isolating layer 2d and the second isolating layer 7a are tantalum nitride layers or the like.

Preferably, the material layer 4 covers the upper surface of the substrate 1 and the inner wall of the base trench 3 (refer to FIG. 18), and the thickness of the material layer 4 is uniform throughout to ensure the performance of the capacitor.

Figure 20:
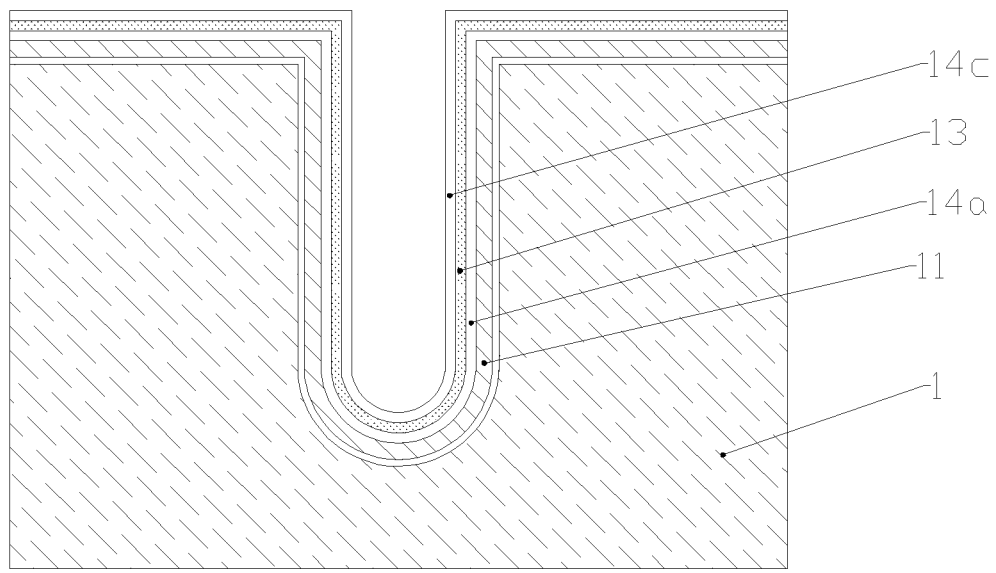
FIG. 20 is a schematic structural diagram of a dielectric layer processed for the third capacitor according to an embodiment of the present disclosure.

Referring to FIG. 20, a second insulating layer 13 is disposed between the third conductor layer 11 and the upper electrode 12a, and the second insulating layer 13 functions similarly to the first insulating layer 6.

In the present embodiment, in order to prevent copper in the third conductor layer 11 from diffusing toward the second insulating layer 13, a third isolating layer 14a is disposed between the second insulating layer 13 and the third conductor layer 11. Similarly, in order to prevent the substances in the upper electrode 12a from diffusing toward the second insulating layer 13, a fourth isolating layer 14c is disposed between the second insulating layer 13 and the upper electrode 12a.

The material of the second insulating layer 13 may be hafnium oxide (HfO2) as a dielectric medium of the capacitor. The third isolating layer 14a and the fourth isolating layer 14c may be made of titanium nitride (TiN) to prevent the substances of the third conductor layer 11 and the upper electrode 12a from diffusing toward the second insulating layer 13 to affect the insulating property thereof, thereby ensuring the performance of the capacitor.

Figure 3:
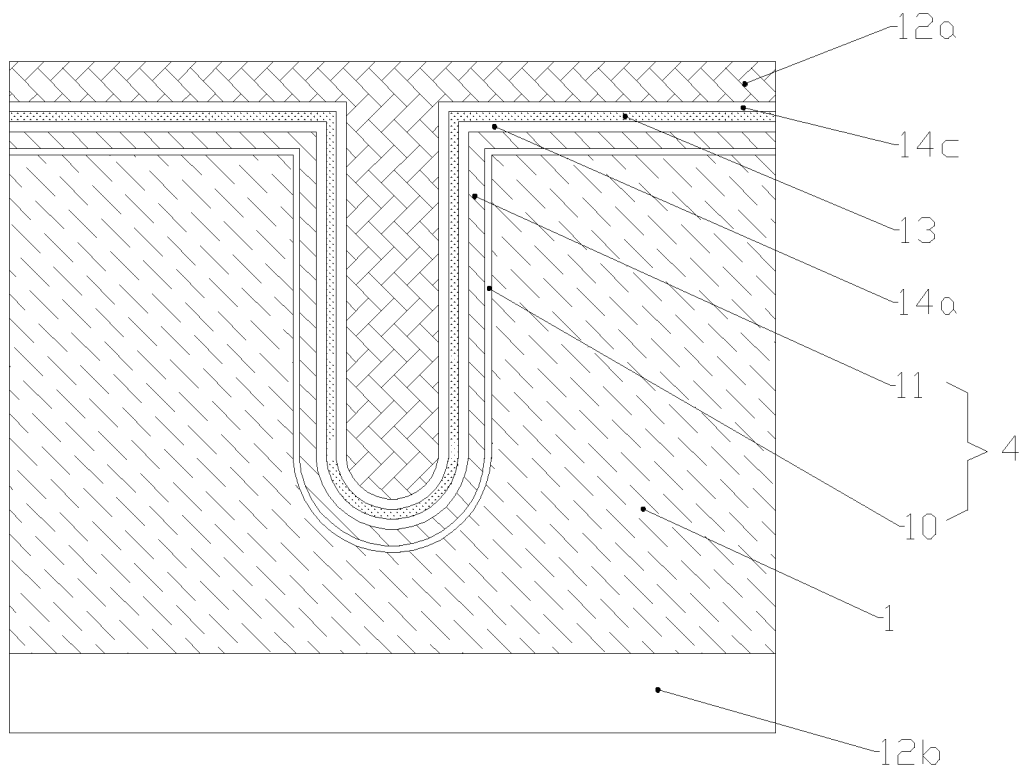
FIG. 3 is a schematic structural diagram of a third capacitor according to an embodiment of the present disclosure.

In the present embodiment, as shown in FIG. 3, the upper electrode 12a includes an upper electrode body and an upper electrode leg, the upper electrode body covers the third conductor layer 11, and the upper electrode leg stretches into the trench structure 2b. The material of the upper electrode 12a may be tungsten. A lower electrode 12b may be disposed on the lower surface of the substrate 1, and the lower electrode 12b is connected to the third conductor layer 11 through the substrate 1.

Figure 4:
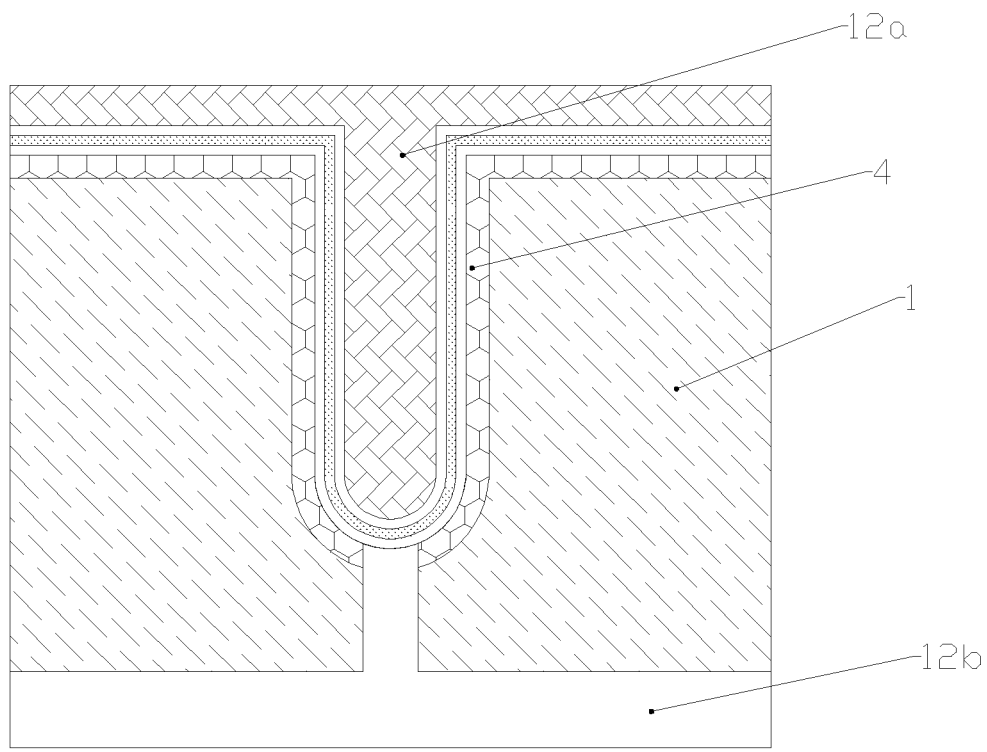
FIG. 4 is a schematic structural diagram of a fourth capacitor according to an embodiment of the present disclosure.

As shown in FIG. 4, in another capacitor structure, when a three-dimensional capacitor is formed based on the trench structure 2b on the substrate, the material layer 4 includes a silicon dioxide layer which can be uniformly grown on the surface of the substrate 1 and the inner wall of the base trench 3 by thermal oxidation. The third isolating layer 14a, the second insulating layer 13, the fourth isolating layer 14c, and the upper electrode 12a are sequentially stacked on the silicon dioxide layer. Since the conductivity of the silicon dioxide layer is poor, in order to fabricate the lower electrode 12b and electrically connect the lower electrode 12b with the third isolating layer 14a, a through hole is provided respectively at the bottom of the substrate 1 and the bottom of the material layer 4, and the lower electrode 12b passes through the through holes and is electrically connected to the third isolating layer 14a.

Figure 5:
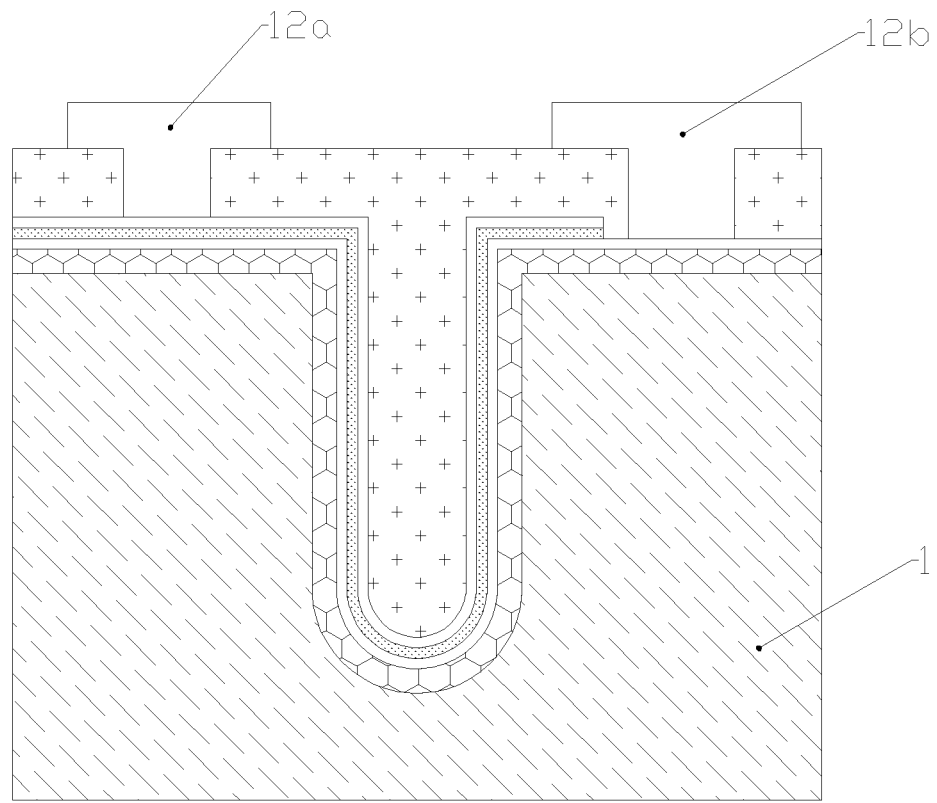
FIG. 5 is a schematic structural diagram of a fifth capacitor according to an embodiment of the present disclosure.

As shown in FIG. 5, in another capacitor structure, the upper electrode 12a and the lower electrode 12b of the capacitor are on the same side, and the material layer 4 of the capacitor also includes a silicon dioxide layer. The third isolating layer 14a, the second insulating layer 13, and the fourth isolating layer 14c are sequentially stacked on the material layer 4. However, the second insulating layer 13 and the fourth isolating layer 14c are different from the third isolating layer 14a in area, and part of the third isolating layer 14a is not covered with the fourth isolating layer 14c and the second insulating layer 13 in order to expose the part of the third isolating layer 14a, thereby facilitating the connection of the electrodes thereto. A polyimide layer covers the fourth isolating layer 14c and the exposed third isolating layer 14a, and the polyimide layer is provided with at least two openings for exposing the fourth isolating layer 14c and the third isolating layer 14a respectively. The upper electrode 12a is connected to the fourth isolating layer 14c through one of the openings, and the lower electrode 12b is connected to the third isolating layer 14a through the other opening.

According to an embodiment of the present disclosure, a capacitor processing method for processing the capacitor described above is also provided, the method including:

A base protrusion 15 is formed on a substrate 1, and the base protrusion 15 is processed to form a pillar structure 2a having an aspect ratio more than 10; or, a base trench 3 is processed on the substrate 1, the surface of the base trench 3 is covered with a material layer 4 to form a trench structure 2b having an aspect ratio more than 10; and a capacitor is formed based on the pillar structure 2a or the trench structure 2b.

First, the base protrusion 15 having a relatively small aspect ratio or the base trench 3 having a relatively small aspect ratio is processed on the substrate 1, and then the base protrusion 15 is processed to decrease the width of the base protrusion 15 by more than the height, and the aspect ratio of the processed pillar structure 2a is increased to be more than 10, thereby improving the performance of the capacitor without enlarging the volume of the capacitor; or the inside of the base trench 3 is covered with the material layer 4, and the trench structure 2b having an aspect ratio more than 10 is formed through the material layer 4, thereby increasing the capacitance density of the capacitor processed based on this.

The capacitor processing method and processing process will be described in detail below:

As shown in FIGS. 7-16, when the structure for forming a three-dimensional capacitor is a pillar structure 2a, the processing of the capacitor is as follows:

Step S201: a substrate 1 is selected.

In one feasible manner, a low resistivity silicon wafer is selected as the substrate. In another feasible manner, glass may be selected as the substrate.

Step S202: base protrusions 15 are processed on the substrate 1.

In a feasible embodiment, the processing of the base protrusions 15 includes:

Sub-step S2021: an adhesion layer 16 is deposited on the upper surface of the substrate 1.

A seed layer 2c may be disposed on the adhesion layer 16. Based on different materials of the substrate 1 and the seed layer 2c, the adhesion layer 16 may be deposited from different materials, for example, a titanium (Ti) layer, a titanium nitride layer or other material. The adhesion layer 16 is mainly used to connect the substrate 1 with the seed layer 2c. When the substrate 1 is a silicon wafer and the material of the seed layer 2c is copper, the adhesion layer 16 may be a titanium nitride layer in order to prevent the copper from diffusing into the substrate 1 to affect the performance of the processed capacitor. If the substrate 1 is glass, the adhesion layer 16 may be made of a UV adhesive in order to facilitate the removal of the substrate 1 in the subsequent process.

Figure 8:
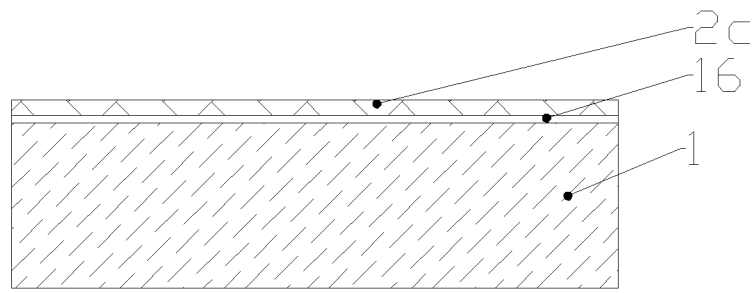
FIG. 8 is a schematic structural diagram of a first base layer processed for the first capacitor according to an embodiment of the present disclosure.

Optionally, since electroplating is high in efficiency and low in cost, if the electroplating is used in the subsequent processing to form the base protrusions 15, a layer of same material as the material of the base protrusion 15 may be deposited as the seed layer 2c on the adhesion layer 16 after the adhesion layer 16 is formed to facilitate subsequent electroplating. The specific process may be: an electroplating seed layer is deposited on the adhesion layer 16, then a copper layer grown by electroplating of the whole surface is used as the seed layer 2c, the thickness of which may be determined based on needs, for example, 10 µm, etc., and the structure after the electroplating is as shown in FIG. 8.

If other processing method except the electroplating is used, the step of depositing the seed layer may be omitted.

In the present embodiment, the material of the seed layer 2c is a conductor, such as copper. Since the resistivity of copper is low, the performance of the capacitor can be well ensured, and the manufacturing cost of the capacitor is effectively reduced.

Sub-step S2022: the adhesion layer 16 is covered with a sacrificial material layer 18, and preformed grooves 19 for forming the base protrusions 15 are formed on the sacrificial material layer 18.

The preformed grooves 19 penetrate the sacrificial material layer 18.

The sacrificial material layer 18 is disposed on the seed layer 2c in the presence of the seed layer 2c, or directly disposed on the adhesion layer 16 in the absence of the seed layer 2c.

The sacrificial material of the sacrificial material layer 18 may be an organic material such as a photoresist or polyimide (PI), or an inorganic material such as glass, an oxide of silicon or a nitride of silicon. The sacrificial material layer 18 is fabricated by spray coating, spin coating, pasting, oxidation, plasma assisted deposition, chemical vapor deposition (CVD), physical vapor deposition (PVD), or the like.

Figure 9:
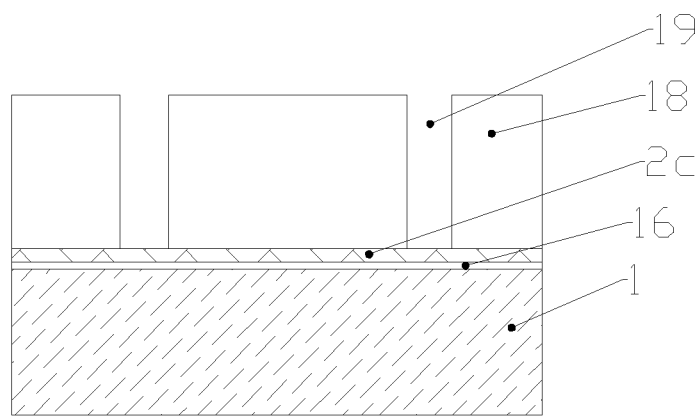
FIG. 9 is a schematic structural diagram of preformed grooves processed for the first capacitor according to an embodiment of the present disclosure.

For example, when the material is a photoresist, a sacrificial material layer 18 having a thickness of 50 microns may be fabricated on the surface of the seed layer 2c by spin coating or the like. Two preformed grooves 19 having a width of 10 microns are obtained by exposure, development, or the like. The fabricated structure is as shown in FIG. 9. Preferably, photoresist SU-8 or JSR 151 may be selected as the sacrificial material.

In other embodiments, the sacrificial material layer 18 may be removed by solution dissolution, wet etching, plasma etching, or the like.

Sub-step S2023: the preformed grooves are filled with a conductor material to form the base protrusions 15.

Figure 10:
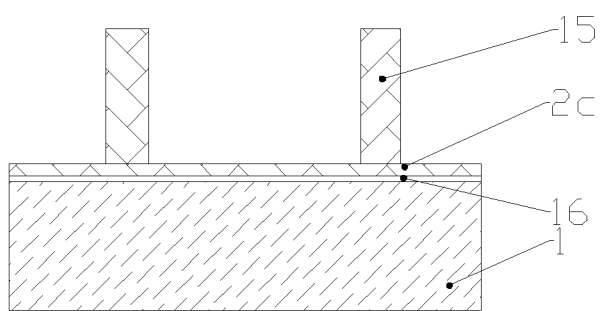
FIG. 10 is a schematic structural diagram of base protrusions processed for the first capacitor according to an embodiment of the present disclosure.

After the preformed grooves 19 are formed, the preformed grooves are filled with a conductor material (such as the material of the seed layer 2c) to form the base protrusions 15. Specifically, for example, copper is grown in the preformed grooves 19 by electroplating to form the base protrusions 15. Finally, the sacrificial material layer 18 is removed, copper pillars having a width of 10 microns and a height of 50 microns are obtained as the base protrusions 15, and the fabricated structure is as shown in FIG. 10.

Alternatively, in order to improve the stability of the base protrusions 15 for subsequent processing, the stability of the processed base protrusions 15 can be made better by adjusting the shape of the preformed grooves 19. For example, the preformed grooves 19 are processed into "well"-shaped or "cross"-shaped grooves, "well"-shaped or "cross"-shaped base protrusions 15 are correspondingly processed, and "well"-shaped pillar structures 2a or "cross"-shaped pillar structures 2a may be formed later.

Step S203: the base protrusions 15 are processed to form pillar structures 2a having an aspect ratio more than 10.

When the base protrusions 15 are processed, etching process may be used. The etching process including isotropic wet etching or isotropic dry etching. The two etching methods can effectively adjust the aspect ratio of the base protrusions 15 to increase the aspect ratio. The cost of processing the pillar structures 2a by this method is lower, and the processing speed is faster. The fabricated structure is as shown in FIG. 11.

Preferably, the wet etching is used, so that a plurality of substrates 1 can be simultaneously processed to further reduce the cost.

After the pillar structures 2a are processed, the seed layer 2c cooperates with the pillar structures 2a to form a first conductor layer 2, and the conductive material of the first conductor layer 2 may be metal, silicon, carbon-based material, titanium nitride, or a combination of the materials. The manufacturing method includes electroplating, evaporation, chemical vapor deposition (CVD), physical vapor deposition (PVD), or the like.

Step S204: the pillar structures 2a are processed to form a capacitor.

In a feasible manner, the following steps are specifically included:

Sub-step S2041: a first insulating layer 6 and a second conductor layer 7 are fabricated on a first conductor layer 2 including the pillar structures 2a.

Figure 12:
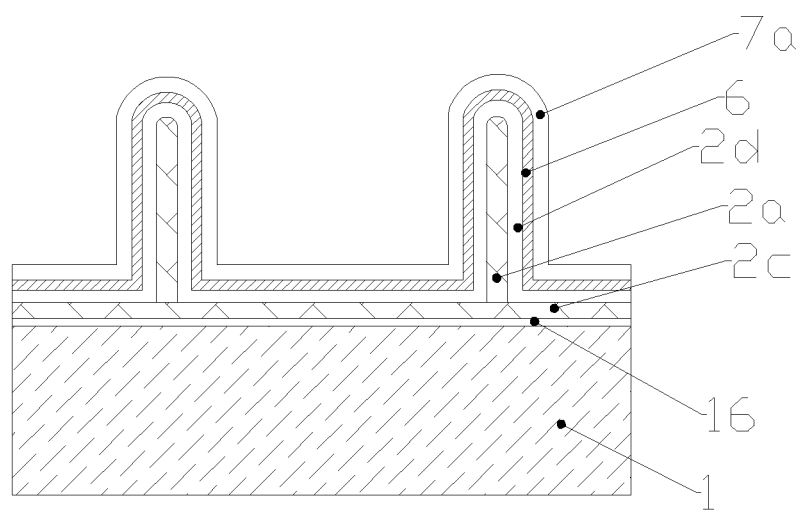
FIG. 12 is a schematic structural diagram of a middle protective layer processed for the first capacitor according to an embodiment of the present disclosure.

Specifically, 4 µm thick copper on the first conductor layer 2 is removed with a copper etching solution to obtain a 6 µm thick first conductor layer 2, where the pillar structures 2a are 2 µm wide and 50 µm high. If the materials of the first conductor layer 2 and the second conductor layer 7 are copper, titanium nitride is deposited as a first isolating layer 2d on the surface of the first conductor layer 2 by atomic layer deposition (ALD) to isolate the first conductor layer 2 and the first insulating layer 6, thereby preventing the copper from diffusing toward the first insulating layer 6. Thereafter, hafnium oxide is deposited as the first insulating layer 6. Titanium nitride is deposited as a second isolating layer 7a on the first insulating layer 6. The low resistivity titanium nitride is used as a barrier layer to prevent the copper from diffusing into the hafnium oxide layer to affect device performance. The hafnium oxide is a high dielectric constant medium. The fabricated structure is as shown in FIG. 12.

If the material of the first conductor layer 2 is not copper, or copper has no influence on the performance of the first insulating layer 6, the first isolating layer 2d may not be disposed between the first conductor layer 2 and the first insulating layer 6, but the first insulating layer 6 is directly processed on the first conductor layer 2.

Of course, in other embodiments, the insulating material of the first insulating layer 6 may be other material such as an oxide of silicon, a nitride of silicon, an oxide of metal, a nitride of metal, or the like. The insulating material may be in one or more layers. The insulating dielectric film is fabricated by atomic layer deposition (ALD), physical vapor deposition (PVD), chemical vapor deposition (CVD), or the like.

Figure 13:
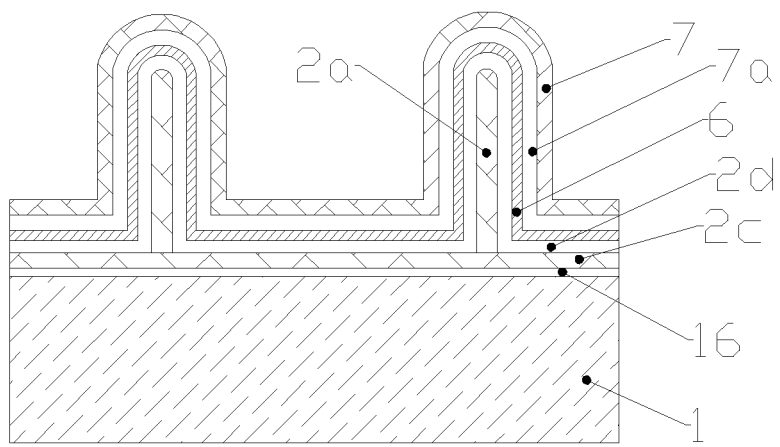
FIG. 13 is a schematic structural diagram of a second conductor layer processed on a substrate for the first capacitor according to an embodiment of the present disclosure.

When the second conductor layer 7 is processed, a layer of copper may be deposited as the electroplating seed layer on the surface of the second isolating layer 7a by physical vapor deposition (PVD). Next, a 10 µm thick copper layer is deposited by electroplating as the second conductor layer 7. The fabricated structure is as shown in FIG. 13.

If the material of the second conductor layer 7 is not copper, or copper has no influence on the performance of the first insulating layer 6, the second isolating layer 7a may not be disposed between the second conductor layer 7 and the first insulating layer 6.

Sub-step S2042: a first electrode 8 is fabricated on the second conductor layer 7, and a second electrode 9 is fabricated on the substrate 1.

Figure 14:
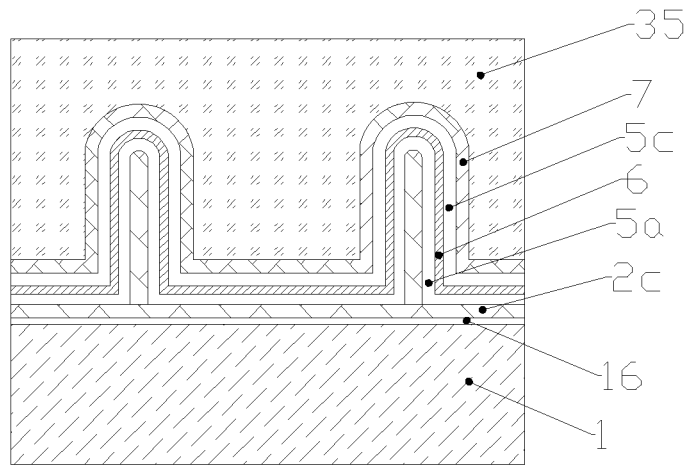
FIG. 14 is a schematic structural diagram of a glass protective layer processed for the first capacitor according to an embodiment of the present disclosure.

Specifically, in one feasible manner, a glass protective layer 35 is formed by SOG (spin-on-glass) to wrap the above fabricated multilayer 3D structure. The fabricated structure is as shown in FIG. 14.

Figure 15:
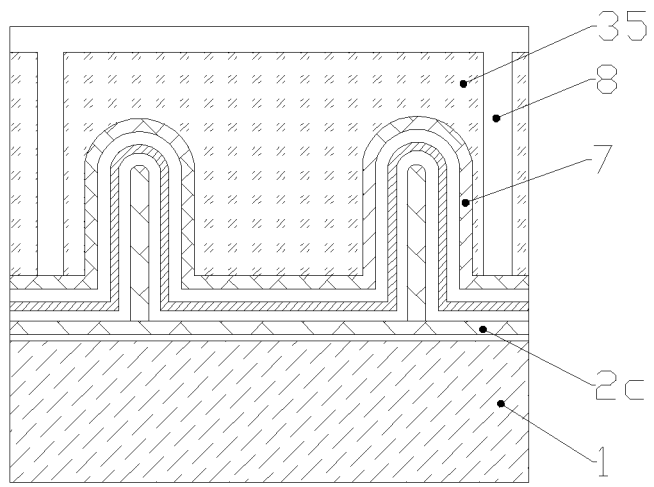
FIG. 15 is a schematic structural diagram of a first electrode processed for the first capacitor according to an embodiment of the present disclosure.

The second conductor layer 7 is exposed by forming an opening on the glass protective layer 35 by photolithography. A copper layer is deposited in the opening as the first electrode 8 of the capacitor. The fabricated structure is as shown in FIG. 15.

Figure 16:
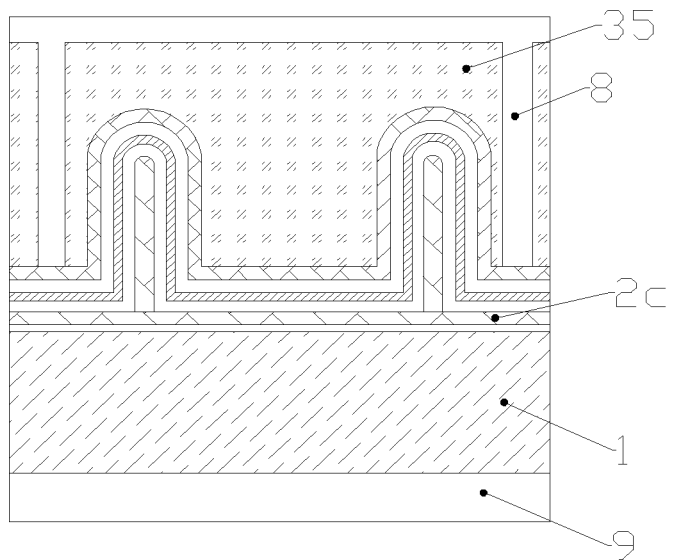
FIG. 16 is a schematic structural diagram of a second electrode processed for the first capacitor according to an embodiment of the present disclosure.
Figure 17:
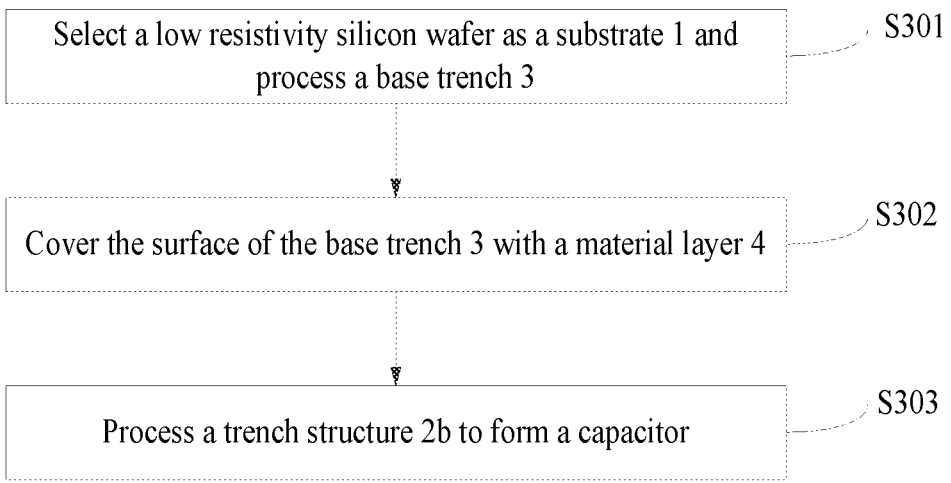
FIG. 17 is a schematic flowchart of a third capacitor processing method according to an embodiment of the present disclosure.

If the substrate 1 is a silicon wafer, the substrate 1 is thinned to 100 µm by back grinding and polishing. A layer of titanium and a layer of copper are deposited as a second electrode 9 of the capacitor on the back of the substrate 1, and the second electrode 9 is electrically connected to the first conductor layer 2 through the substrate 1. The fabricated structure is as shown in FIG. 16.

If the substrate 1 includes glass, after the first electrode 8 is fabricated on the second conductor layer 7, the glass of the substrate 1 is removed, and the second electrode 9 is fabricated on the exposed seed layer 2c. The fabricated structure is as shown in FIG. 2. The glass may be removed by irradiating the back of the glass with UV (ultraviolet) to reduce the viscosity of the UV adhesive. Thus, the substrate can be reused to reduce the cost.

As shown in FIGS. 17-29, when the structure for forming a three-dimensional capacitor is a trench structure 2b, the processing of the capacitor is as follows:

Step S301: a silicon wafer having a low resistivity (for example, 0.001 Ω·cm) is selected as a substrate 1 and processed to form a base trench 3.

Figure 18:
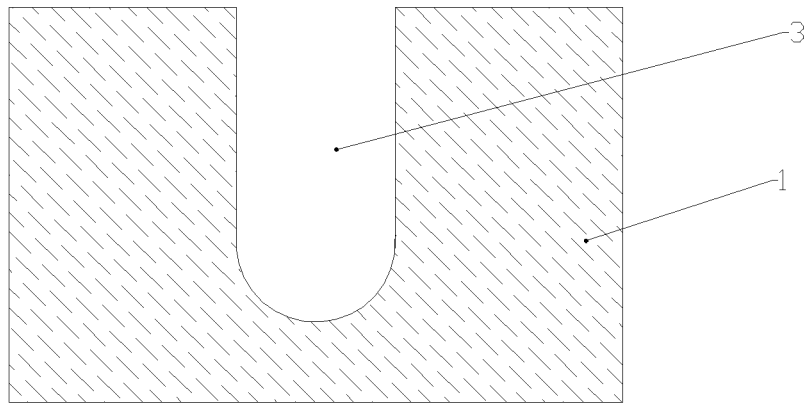
FIG. 18 is a schematic structural diagram of a base trench processed for a third capacitor according to an embodiment of the present disclosure.

For example, the base trench 3 having a width of 10 µm and a depth of 100 µm is fabricated on the surface of the substrate 1 by a DRIE (Deep Reactive Ion Etching) method. The fabricated structure is as shown in FIG. 18.

Step S302: the surface of the base trench 3 is covered with a material layer 4.

A trench structure 2b having a larger aspect ratio may be formed by covering the surface of the base trench 3 with the material layer 4. The material layer 4 may be made of a conductive material or an insulating material.

In a feasible embodiment, if the material layer 4 is made of a conductive material, the coverage of the material layer 4 includes:

A barrier layer 10 and an electroplating seed layer are deposited in the base trench 3, and a third conductor layer 11 is electroplated on the electroplating seed layer to form the material layer 4, where he material of the third conductor layer 11 is the same as the material of the electroplating seed layer.

Figure 19:
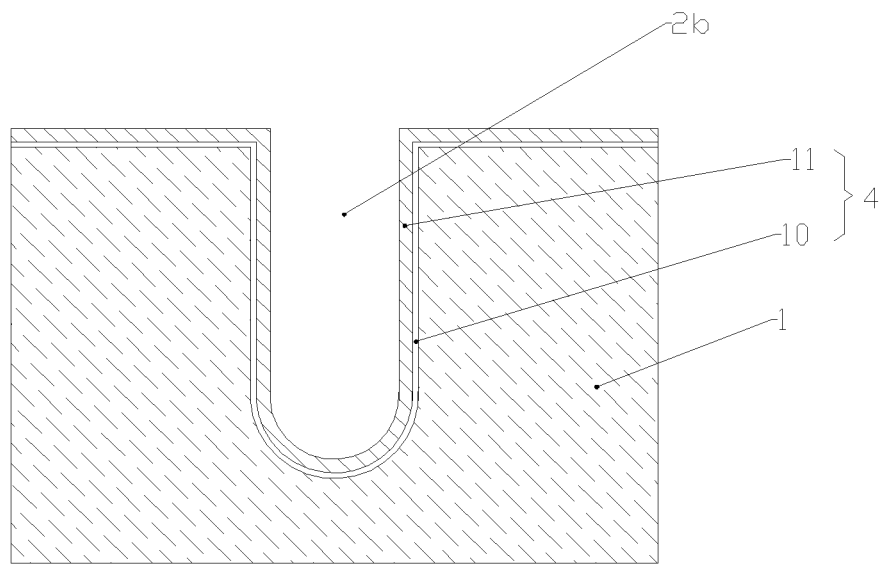
FIG. 19 is a schematic structural diagram of a material layer processed for the third capacitor according to an embodiment of the present disclosure.

Specifically, the barrier layer 10 may be formed by depositing a layer of titanium nitride (TiN) on the surface of the substrate 1 and the inner wall of the base trench 3 through a PVD (Physical Vapor Deposition) method, and the electroplating seed layer may be a copper layer having a thickness of tens to hundreds of nanometers. Thereafter, a 2 µm thick copper layer is uniformly grown on the surface of the substrate 1 and the inner wall of the base trench 3 by electroplating to form the third conductor layer 11. The fabricated structure is as shown in FIG. 19.

If the material layer 4 is made of an insulating material, the coverage of the material layer 4 includes:

A layer of silicon dioxide is grown as the material layer 4 in the base trench 3 by thermal oxidation.

Step S303: a trench structure 2b is processed to form a capacitor.

After the material layer 4 is formed, if the material layer 4 is made of a conductive material, when the trench structure 2b is processed to form a capacitor, at least a second insulating layer 13 and a conductive layer are fabricated on the surface of the material layer 4 as a dielectric medium and an upper electrode 12a of the capacitor. If the material layer 4 is made of an insulating material, when the trench structure 2b is processed to form a capacitor, a conductive layer, a second insulating layer 13 and a conductive layer are sequentially fabricated on the surface of the material layer 4 as a lower electrode, a dielectric medium and an upper electrode of the capacitor.

Figure 21:
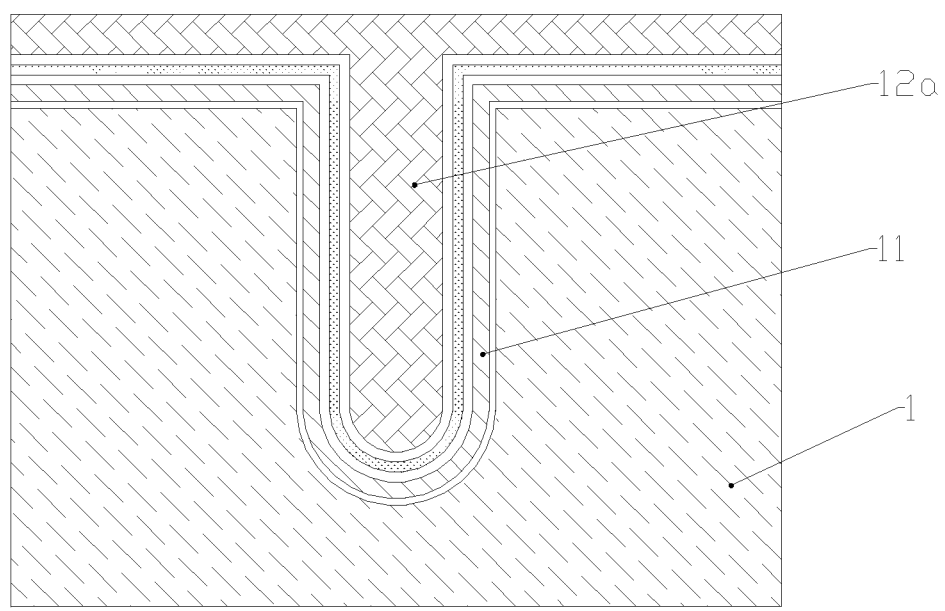
FIG. 21 is a schematic structural diagram of an upper electrode processed for the third capacitor according to an embodiment of the present disclosure.
Figure 22:
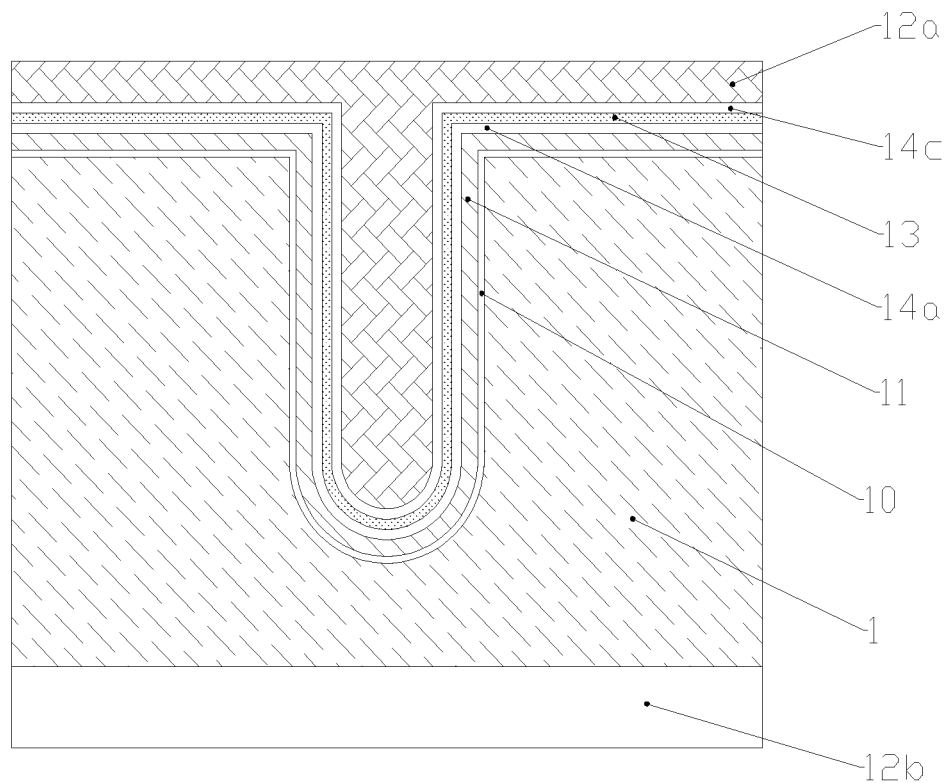
FIG. 22 is a schematic structural diagram of a lower electrode processed for the third capacitor according to an embodiment of the present disclosure.

When the material layer 4 is made of a conductive material, the second insulating layer 13 may be formed by ALD (atomic layer deposition). If the third conductor layer 11 is made of copper or the like, a 15 nm thick titanium nitride layer (as a third isolating layer 14a), a 10 nm thick hafnium oxide (HfO2) layer (as a second insulating layer 13) and another 15 nm thick titanium nitride layer (as a fourth isolating layer 14c) are sequentially deposited on the surface of the third conductor layer 11 in order to prevent copper diffusion. The fabricated structure is as shown in FIG. 20. When the upper electrode 12a is fabricated, metal tungsten may be deposited as the upper electrode 12a of the capacitor in the trench structure 2b by CVD (Chemical Vapor Deposition). The fabricated structure is as shown in FIG. 21. The substrate 1 is thinned by back grinding and polishing, and a layer of aluminum (Al) is deposited as a lower electrode 12b of the capacitor on the back of the substrate 1. The fabricated structure is as shown in FIG. 22.

When the material layer 4 is made of an insulating material, a layer of silicon dioxide may be uniformly grown on the inner wall of the base trench 3 as the material layer 4 by thermal oxidation. Since the silicon dioxide is an insulating material, an electrode is extracted from the back or front side of the substrate 1 by additional photolithography when the lower electrode 12b of the capacitor is fabricated.

Figure 23:
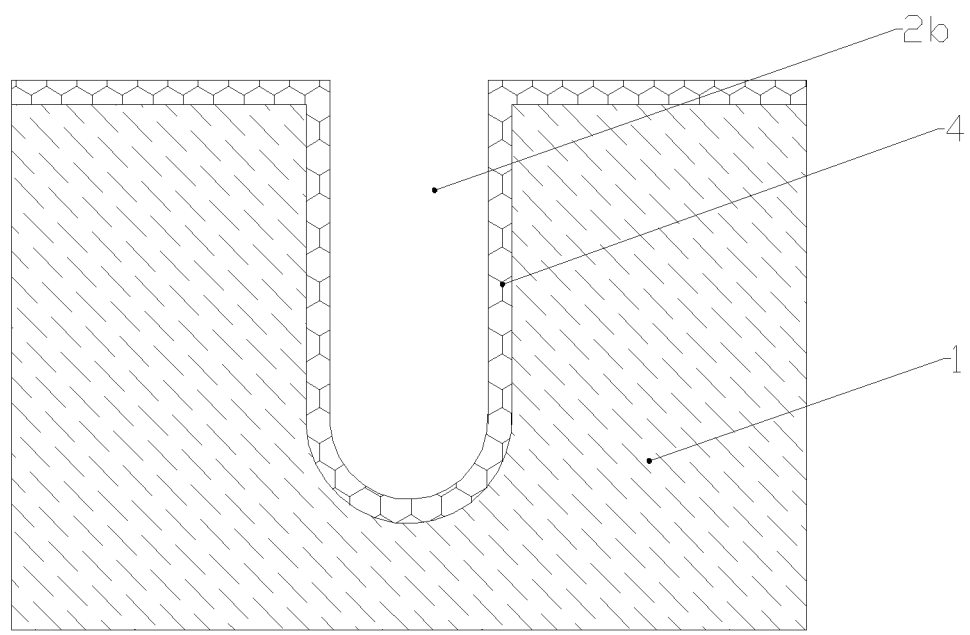
FIG. 23 is a schematic structural diagram of a material layer processed for a fourth capacitor according to an embodiment of the present disclosure.

Specifically, in a feasible manner, the substrate is placed in a furnace tube, and a mixed gas of hydrogen and oxygen or oxygen containing water vapor is introduced to grow silicon dioxide under a high temperature condition. The fabricated structure is as shown in FIG. 23.

Figure 24:
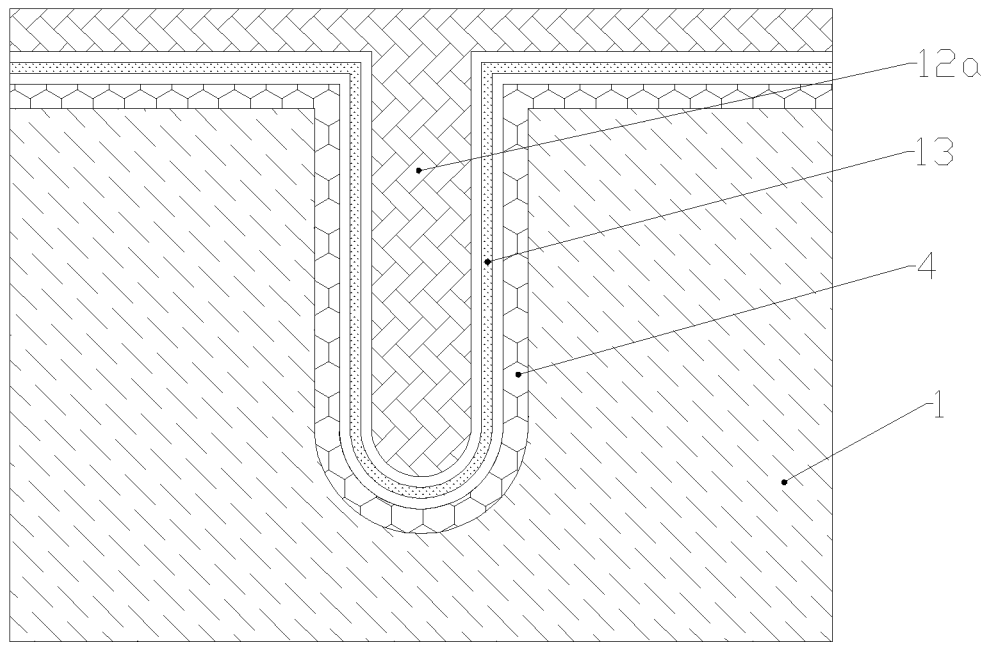
FIG. 24 is a schematic structural diagram of an upper electrode and a dielectric layer processed for the fourth capacitor according to an embodiment of the present disclosure.
Figure 25:
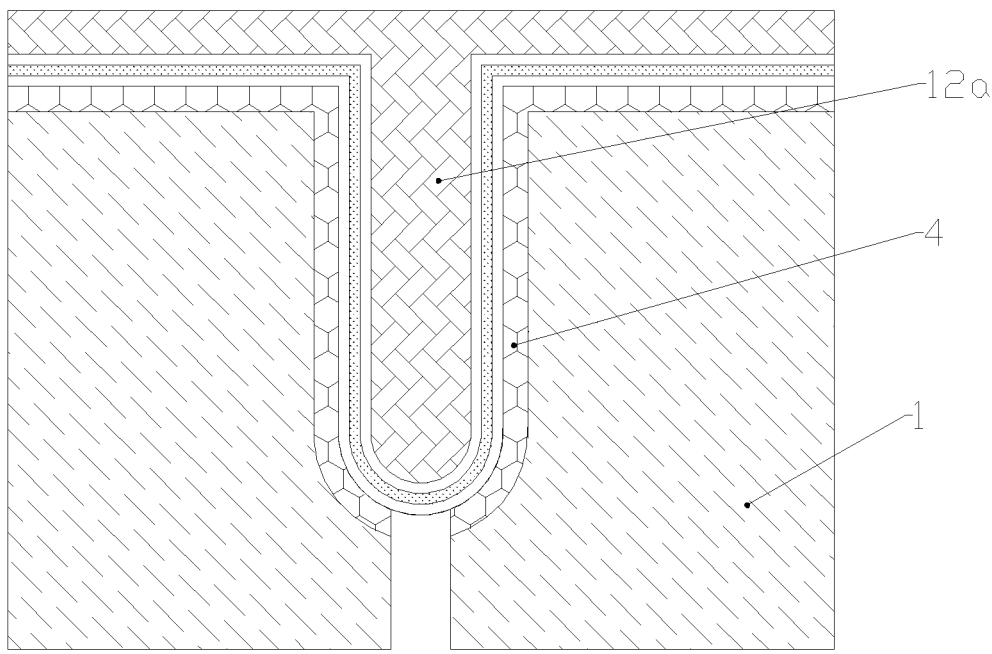
FIG. 25 is a schematic structural diagram of a perforation of the fourth capacitor according to an embodiment of the present disclosure.
Figure 26:
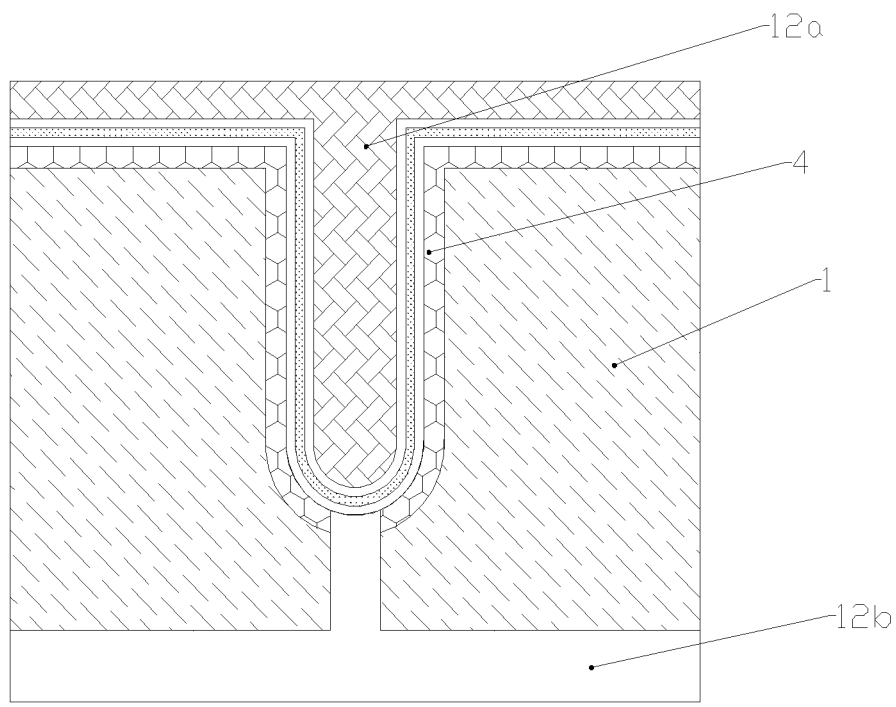
FIG. 26 is a schematic structural diagram of a lower electrode processed for the fourth capacitor according to an embodiment of the present disclosure.

Then, a titanium nitride layer, a hafnium oxide layer and another titanium nitride layer may be sequentially deposited on the surface of the silicon dioxide by ALD as a third isolating layer 14a, a second insulating layer 13 and a fourth isolating layer 14c, where the two titanium nitride layers may be used as conductor layers. The trench structure 2b is filled with metal tungsten as an upper electrode 12a by CVD. The fabricated structure is as shown in FIG. 24. Thereafter, after the back of the substrate 1 is thinned and polished, the back of the substrate 1 is perforated to expose the lower titanium nitride layer by dry etching and wet etching, and the fabricated structure is as shown in FIG. 25. A layer of Al is then deposited by PVD to fabricate a lower electrode. The fabricated structure is as shown in FIG. 26.

Figure 27:
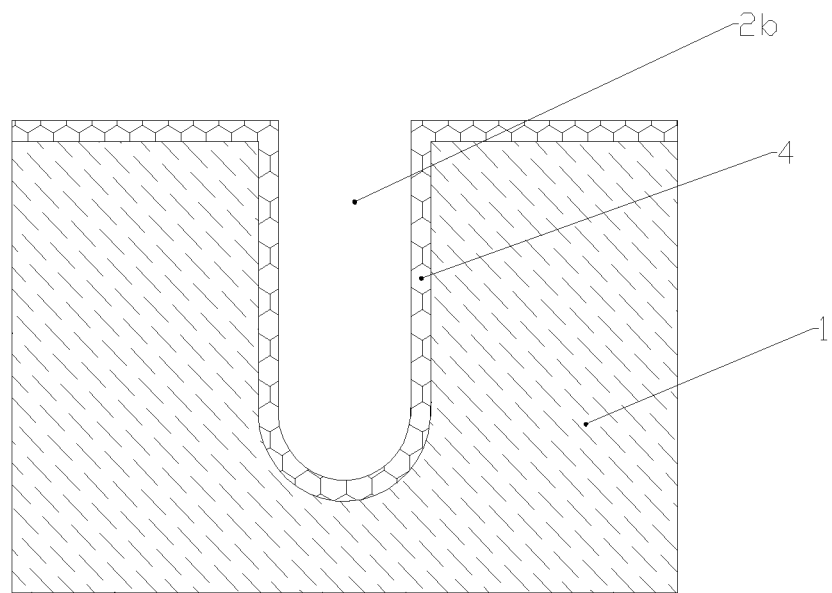
FIG. 27 is a schematic structural diagram of a material layer processed for a fifth capacitor according to an embodiment of the present disclosure.
Figure 28:
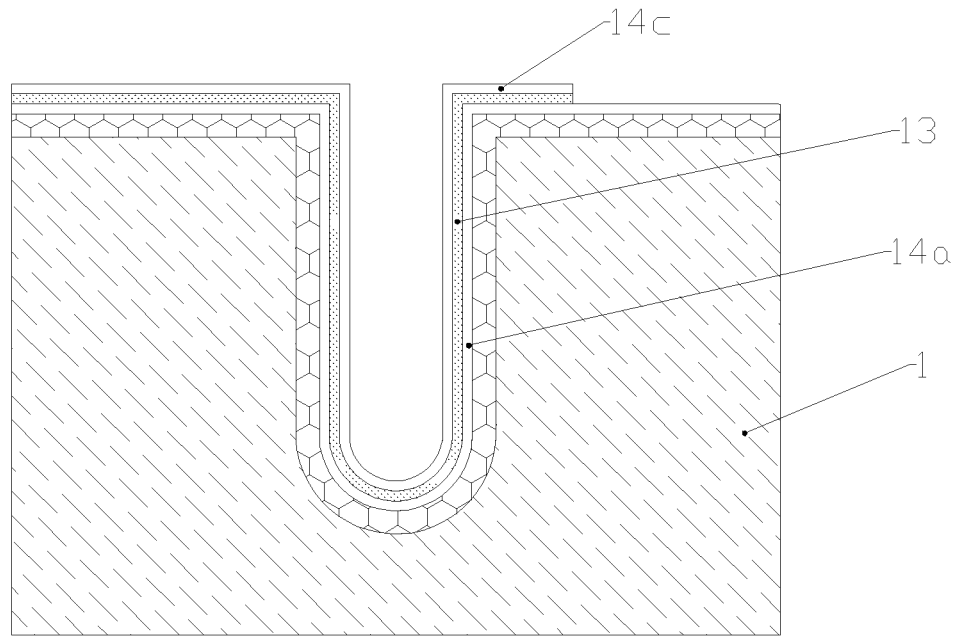
FIG. 28 is a schematic structural diagram of a dielectric layer processed for the fifth capacitor according to an embodiment of the present disclosure.
Figure 29:
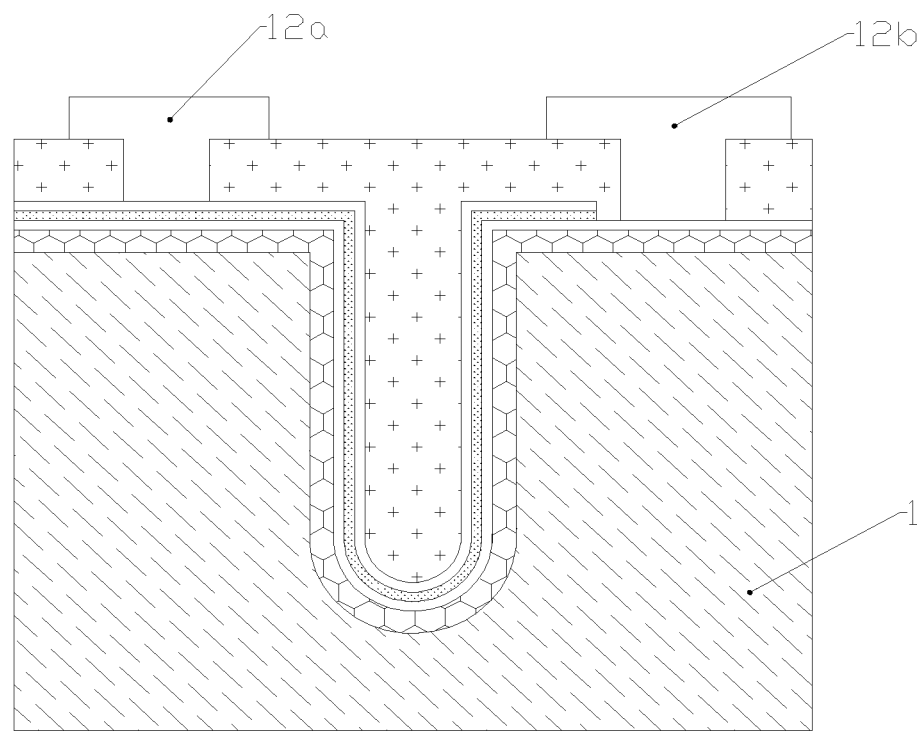
FIG. 29 is a schematic structural diagram of an upper electrode and a lower electrode processed for the fifth capacitor according to an embodiment of the present disclosure.

In another feasible manner, the substrate 1 is placed in a furnace tube, a mixed gas of hydrogen and oxygen or oxygen containing water vapor is introduced to grow silicon dioxide under a high temperature condition, and the fabricated structure is as shown in FIG. 27. By means of ALD, a titanium nitride layer (as a third isolating layer 14a), a 10 nm thick hafnium oxide (HfO2) layer (as a second insulating layer 13), and another 15 nm thick titanium nitride layer (as a fourth isolating layer 14c) are sequentially deposited on the surface of the silicon dioxide. Part of the upper titanium nitride layer and the hafnium oxide (HfO2) layer are removed to expose the lower titanium nitride layer. The fabricated structure is as shown in FIG. 28. Polyimide (PI) is spin-coated to form a polyimide layer, and at least two windows are formed on the polyimide layer. At least one of the windows exposes the lower titanium nitride layer, and the other window exposes the upper titanium nitride layer. An Al (aluminum) layer is formed by PVD and patterned to fabricate an upper electrode 12a and a lower electrode 12b. The fabricated structure is as shown in FIG. 29.

According to the capacitor processing method, columnar or wall-like base protrusions or a base trench having a low AR are fabricated first. For the base protrusions, the AR of the pillar structures after etching is improved through isotropic dry/wet etching by adjusting the etching time, so that the aspect ratio of the 3D structure is improved simply. For the base trench, the aspect ratio of the formed trench structure can be improved simply by depositing a material layer with uniform thickness on the inner wall of the base trench and the surface of the substrate. In this way, not only can a wafer-level 3D capacitor be processed with low cost and easy operation, but also a 3D structure with ultra-large AR and a 3D capacitor based on the structure can be fabricated.

It should be noted that the above description of quantity is only for the purpose of clearly interpreting the embodiments of the present disclosure, and is not particularly limited.

In addition, it should be appreciated by those skilled in the art that the above unit and module divisions are only one of numerous divisions. If the units and modules are divided into other units or modules or not divided, as long as the information objects have the above functions, the divisions should fall into the scope of the present disclosure.

Although the preferred embodiments of the present disclosure are described, those skilled in the art can make further variations and modifications to these embodiments once they are aware of the basic inventive concept. Therefore, the appended claims are intended to be interpreted as including the preferred embodiments and all the variations and modifications falling into the scope of the present disclosure. Apparently, those skilled in the art can make various modifications and variations to the present disclosure without departing from the spirit and scope of the present disclosure. Thus, these modifications and variations of the present disclosure fall into the scope of the claims of the present disclosure and equivalent technologies thereof, the present disclosure is intended to include these modifications and variations.

What is claimed is:

1. A method for fabricating a capacitor, comprising:
   fabricating a base protrusion on a substrate;
   etching the base protrusion to increase an aspect ratio of the base protrusion and form a pillar structure having an aspect ratio more than 10; and processing the pillar structure to form the capacitor;
   wherein the fabricating the base protrusion on the substrate comprises:
      depositing an adhesion layer on an upper surface of the substrate;
      applying a sacrificial material layer on the adhesion layer, and forming a substantially cross-shaped preformed groove for forming the base protrusion on the sacrificial material layer, the preformed groove penetrating the sacrificial material layer; and
      filling the cross-shaped preformed groove with a conductor material to form the base protrusion, wherein the base protrusion is formed substantially in a cross shape corresponding to the preformed groove.

2. The method according to claim 1, wherein the etching the base protrusion comprises etching the base protrusion with isotropic wet etching or isotropic dry etching.

3. The method according to claim 1, wherein the processing the pillar structure to form the capacitor comprises:
   fabricating a first insulating layer and a second conductor layer on a first conductor layer, wherein the first conductor layer comprises a seed layer and the pillar structure;
   fabricating a first electrode on the second conductor layer, and fabricating a second electrode on the substrate; or, when the substrate comprises glass, fabricating a first electrode on the second conductor layer, removing the substrate, and fabricating a second electrode on the seed layer.

4. The method according to claim 1, wherein the aspect ratio of the pillar structure is less than or equal to 500.

5. The method according to claim 3, wherein the first conductor layer is disposed adjacent to the substrate and covers at least part of the substrate to form the pillar structure.

6. The method according to claim 3, wherein a material of the first conductor layer is copper, a first isolation layer is disposed between the first conductor layer and the first insulating layer, and the first isolating layer is configured to prevent substances of the first conductor layer from diffusing toward the first insulating layer; and/or a second isolating layer is disposed between the second conductor layer and the first insulating layer, and the second isolating layer is configured to prevent a substance of the second conductor layer from diffusing toward the first insulating layer.

7. The method according to claim 3, wherein a material of the first conductor layer is nickel, the first insulating layer is in contact with the first conductor layer and covers the first conductor layer.

* * * * *